US011441233B2

(12) United States Patent
Wang et al.

(10) Patent No.: US 11,441,233 B2
(45) Date of Patent: Sep. 13, 2022

(54) TEMPERATURE FIELD DEVICE COMPRISING A FIRST DRUM, A SECOND DRUM, AND A FILLER INSIDE THE SECOND DRUM AND A SPACE BETWEEN THE SECOND DRUM AND THE FIRST DRUM

(71) Applicant: MEISHAN BOYA ADVANCED MATERIALS CO., LTD., Sichuan (CN)

(72) Inventors: Yu Wang, Meishan (CN); Weiming Guan, Meishan (CN); Zhenxing Liang, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 0 days.

(21) Appl. No.: 17/207,734

(22) Filed: Mar. 21, 2021

(65) Prior Publication Data
US 2021/0207285 A1 Jul. 8, 2021

Related U.S. Application Data

(63) Continuation of application No. 16/903,345, filed on Jun. 16, 2020, now Pat. No. 10,982,349, which is a
(Continued)

(51) Int. Cl.
*C30B 35/00* (2006.01)
*C30B 15/14* (2006.01)
*C30B 29/22* (2006.01)

(52) U.S. Cl.
CPC .............. *C30B 15/14* (2013.01); *C30B 29/22* (2013.01)

(58) Field of Classification Search
CPC ......... C30B 15/00; C30B 15/10; C30B 15/14; C30B 29/10; C30B 29/16; C30B 29/22;
(Continued)

(56) References Cited

U.S. PATENT DOCUMENTS 3,481,711 A * 12/1969 Mitsuhiro ............. C30B 11/007
117/223
4,282,184 A 8/1981 Fiegl et al.
(Continued)

FOREIGN PATENT DOCUMENTS

CN 1414146 A * 4/2003
CN 1414146 A 4/2003
(Continued)

OTHER PUBLICATIONS

First Office Action in Chinese Application No. 201980051051.8 dated May 21, 2021, 14 pages.
(Continued)

*Primary Examiner* — Kenneth A Bratland, Jr.
(74) *Attorney, Agent, or Firm* — Metis IP LLC

(57) ABSTRACT

The present disclosure provides an open temperature field device, including a bottom plate, a drum, a filler, and a cover plate. The bottom plate may be mounted on a bottom of the temperature field device and cover an open end of the drum. The cover plate may be mounted on a top of the temperature field device and cover the other open end of the drum. The filler may be filled inside the drum. In the temperature field device, the filler filled inside the drum can form a new thermal insulation layer, which effectively prevents the problem of sudden temperature changes caused by the cracking of the drum and improves the stability performance and a count of reusable times of the temperature field device.
(Continued)

Meanwhile, by adjusting the filling height and the tightness of the filler, the temperature gradient of the temperature field device can be adjusted.

19 Claims, 4 Drawing Sheets

Related U.S. Application Data continuation of application No. PCT/CN2019/101692, filed on Aug. 21, 2019.

(58) Field of Classification Search
CPC ..... C30B 35/00; C30B 35/002; Y10T 117/00; Y10T 117/10; Y10T 117/1004; Y10T 117/1012; Y10T 117/1024; Y10T 117/1032; Y10T 117/106; Y10T 117/1064; Y10T 117/1068; F27B 14/00; F27B 14/06; F27B 14/061; F27B 14/08; F27B 14/0825; F27B 14/0837; F27B 14/0843; F27B 14/0875; F27B 14/10
USPC .... 117/11, 13, 200–201, 203–204, 206, 208, 117/213, 215–217
See application file for complete search history.

(56) References Cited

U.S. PATENT DOCUMENTS

| | | | |
|---|---|---|---|
| 4,980,015 A * | 12/1990 | Ono | C30B 15/04 117/213 |
| 5,164,041 A | 11/1992 | Berkstresser et al. | |
| 5,958,133 A | 9/1999 | Boulaev | |
| 5,961,715 A | 10/1999 | Ikeda | |
| 6,132,508 A * | 10/2000 | Berthold | C30B 35/002 117/208 |
| 10,844,514 B1 | 11/2020 | Wang et al. | |
| 10,982,349 B2 * | 4/2021 | Wang | C30B 29/22 |
| 10,995,102 B2 | 5/2021 | Wang et al. | |
| 2001/0001944 A1 | 5/2001 | Kitamura et al. | |
| 2002/0139297 A1 | 10/2002 | Wakita et al. | |
| 2008/0202721 A1 * | 8/2008 | Lee | C30B 15/14 164/485 |
| 2014/0116325 A1 * | 5/2014 | Kamei | C30B 19/08 117/208 |
| 2016/0319458 A1 * | 11/2016 | Kim | C30B 15/26 |
| 2019/0017191 A1 | 1/2019 | Kang et al. | |

FOREIGN PATENT DOCUMENTS

| | | | |
|---|---|---|---|
| CN | 2571773 Y | | 9/2003 |
| CN | 201321505 Y | | 10/2009 |
| CN | 102877116 A | | 1/2013 |
| CN | 102877116 A | * | 1/2013 |
| CN | 202945378 U | * | 5/2013 |
| CN | 202945378 U | | 5/2013 |
| CN | 103147119 A | * | 6/2013 |
| CN | 103147119 A | | 6/2013 |
| CN | 203393268 U | | 1/2014 |
| CN | 104294353 A | | 1/2015 |
| CN | 106435712 A | | 2/2017 |
| CN | 207331107 U | | 5/2018 |
| CN | 109338461 A | | 2/2019 |
| CN | 210420255 U | | 4/2020 |
| JP | H11189487 A | | 7/1999 |

OTHER PUBLICATIONS

Aldrich, S., "Particle Size Conversion Table", Web page <https://www.sigmaaldrich.comichemistrylstockroom-reagents/learning-centerltechnical-library/particle-size-conversion>, Jul. 20, 2020.
First Office Action in Chinese Application No. 202111531912.8 dated Jun. 14, 2022, 16 pages.

* cited by examiner

200

TEMPERATURE FIELD DEVICE COMPRISING A FIRST DRUM, A SECOND DRUM, AND A FILLER INSIDE THE SECOND DRUM AND A SPACE BETWEEN THE SECOND DRUM AND THE FIRST DRUM

CROSS-REFERENCE TO RELATED APPLICATIONS

This application is a continuation of U.S. application Ser. No. 16/903,345 filed on Jun. 16, 2020, which is a continuation of International Application No. PCT/CN2019/101692, filed on Aug. 21, 2019, the entire contents of which are hereby incorporated by reference.

TECHNICAL FIELD

The present disclosure generally relates to the field of crystal growth, and in particular, to a temperature field device used for crystal growth and a method for crystal growth.

BACKGROUND

With the rapid development of science and technology, the quality requirements of single crystal materials in various fields become increasingly high. The production of crystals with relatively large diameters can improve the optical uniformity of crystal products and improve production efficiency. The growth of single crystals with relatively large size and relatively high quality depends on the long-term stability of the apparatus, the reliability of the production water and electricity supply, and the temperature field device and growth process suitable for crystal growth. At present, one of the main techniques for growing single crystal materials is the Czochralski technique. During the crystal growth process using the Czochralski technique, the quality of the temperature field has a great influence on the quality of single crystal growth. Under an appropriate temperature field, high-quality single crystals can be grown, whereas, under a bad temperature field, single crystals may become polycrystalline or a seed crystal cannot be led. Although under some temperature fields single crystals can be grown, the quality of the single crystals is relatively poor with dislocations and other structural defects. Therefore, it is desirable to provide an improved temperature field used for growing high-quality crystals.

SUMMARY

One embodiment of the present disclosure provides a temperature field device, including a bottom plate, a cover plate, a drum, and a filler. The bottom plate may be mounted on a bottom of the temperature field device and cover an open end of the drum. The cover plate may be mounted on a top of the temperature field device and cover the other open end of the drum. The filler may be inside the drum.

One embodiment of the present disclosure provides a temperature field device, including a bottom plate, a first cover plate, a first drum, a second drum, and a filler. The bottom plate may be mounted on a bottom of the temperature field device and cover an open end of the first drum. The first cover plate may be mounted on a top of the temperature field device and cover the other open end of the first drum. The second drum may be mounted inside the first drum. The filler may be filled inside the second drum, and/or a space between the second drum and the first drum.

In some embodiments, the filler inside the second drum may be at least configured to support a crucible and cover at least a portion of the crucible.

In some embodiments, an upper edge of the crucible may be higher than a filling height of the filler located inside the second drum.

In some embodiments, the filling height of the filler may result in that a vertical distance between the upper edge of the crucible supported by the filler and an upper edge of an induction coil mounted outside the temperature field device to be from 0 mm~±50 mm. "−" may represent that the upper edge of the crucible is lower than the upper edge of the induction coil, and "+" may represent that the upper edge of the crucible is higher than the upper edge of the induction coil.

In some embodiments, the filler may include a granule shaped material, a brick shaped material, and/or a felt shaped material, and the filler is made of a heat resistant material.

In some embodiments, the filler may include at least one of a zircon sand, a zirconia particle, an alumina particle, a zirconia felt, a zirconia brick, and/or an alumina brick.

In some embodiments, a particle size of the filler may be 5 mesh~200 mesh, 50 mesh~150 mesh, or 80 mesh~120 mesh.

In some embodiments, the first drum may include a quartz tube or a corundum tube, or the first drum may be made of a heat resistant material.

In some embodiments, a thickness of the first drum may be 1 mm~15 mm, and a height of the first drum may 600 mm~1600 mm.

In some embodiments, the first cover plate may include at least one first through hole. The at least one first through hole may be configured to pass a gas through.

In some embodiments, the temperature field device may further comprise a second cover plate. The second cover plate may be mounted inside the first drum, and cover an open end of the second drum near the first cover plate. The second cover plate may include a through hole corresponding to the at least one through hole on the first cover plate.

In some embodiments, the second cover plate may include an alumina plate, or a zirconia plate, or be made of a heat resistant material.

In some embodiments, the gas may include one or more of oxygen and/or inert gases; the gas may include a combination of oxygen and one or more of inert gases; or the gas may include a combination of hydrogen or carbon monoxide and one or more of inert gases.

In some embodiments, the gas may include one or more of nitrogen, argon, oxygen, or carbon monoxide.

In some embodiments, the first through hole may be configured to observe. An observation unit may be mounted above the first through hole. The observation unit may include a chamber connected with the first through hole, a second through hole connected with the chamber, and an observation component. The second through hole may be configured to pass the gas through.

In some embodiments, the observation window may be mounted on a top of the observation unit.

In some embodiments, the first cover plate may include a third through hole through which a pulling rod can enter into and exit from the temperature field device.

Another embodiment of the present disclosure provides a method for crystal growth, which may use the temperature field device disclosed elsewhere in the present disclosure to grow crystals.

In some embodiments, the method may further include adjusting an amount and a tightness of the filler according to a crystal growth condition.

In some embodiments, the method may further include passing the gas through the at least one first through hole.

In some embodiments, the method may further include discharging the gas through the at least one first through hole, or discharging the gas through the third through hole.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

Figure 1:
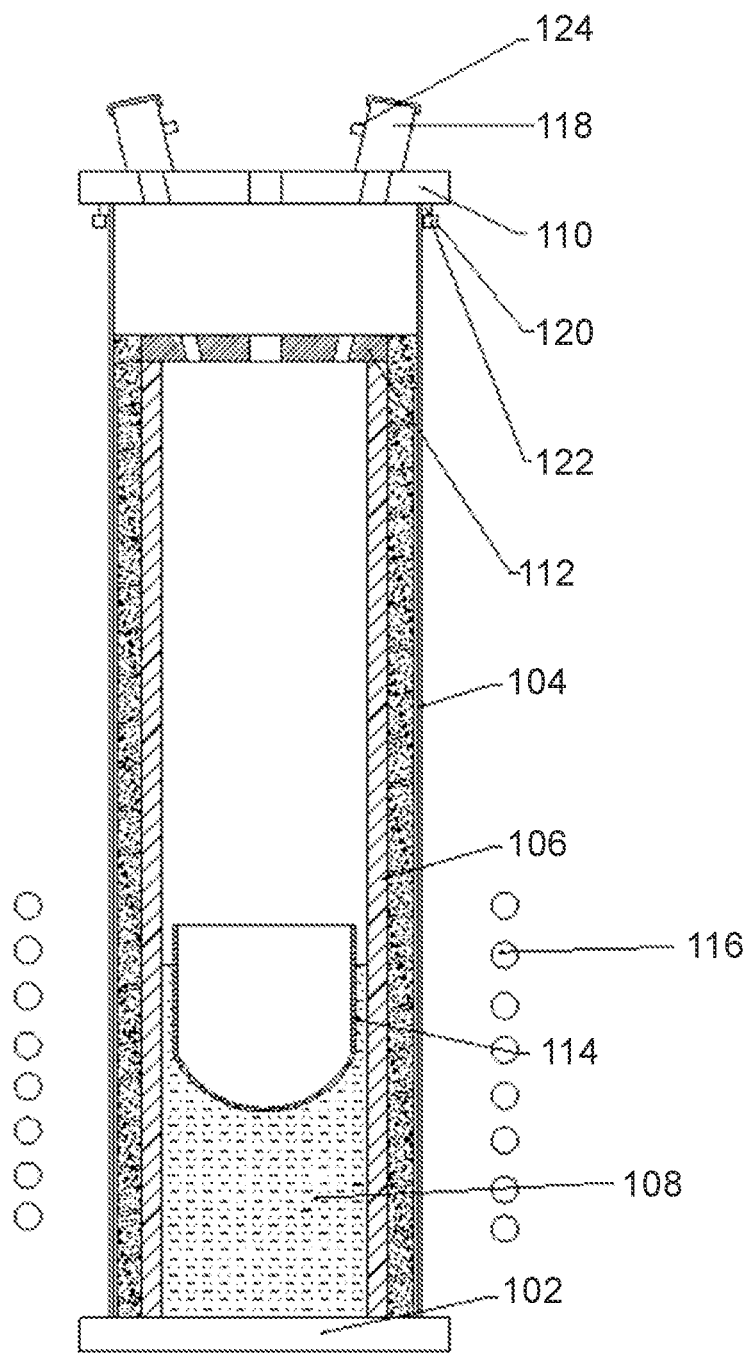
FIG. 1 is a schematic diagram illustrating an exemplary temperature field device according to some embodiments of the present disclosure.

102 refers to a bottom plate, 104 refers to a first drum, 106 refers to a second drum, 108 refers to a filler, 110 refers to a first cover plate, 112 refers to a second cover plate, 114 refers to a crucible, 116 refers to an induction coil, 118 refers to an observation unit, 120 refers to a sealing ring, 122 refers to a pressure ring, 124 refers to a gas channel, 310 refers to a first through hole, 320 refers to a coolant channel, 330-1/2 refers to a coolant inlet, 330-3 refers to a coolant outlet, 340 refers to a circulating coolant channel, 350 refers to a third through hole, 410 refers to a first part, 420 refers to a second through hole, 430 refers to a second part, and 440 refers to an observation window.

DETAILED DESCRIPTION

In order to illustrate the technical solutions related to the embodiments of the present disclosure, a brief introduction of the drawings referred to the description of the embodiments is provided below. Obviously, drawings described below are only some examples or embodiments of the present disclosure. Those having ordinary skills in the art, without further creative efforts, may apply the present disclosure to other similar scenarios according to these drawings. Unless apparent from the locale or otherwise stated, like reference numerals represent similar structures or operation throughout the several views of the drawings.

It will be understood that the terms "system," "device," "unit," and/or "module" used herein are one method to distinguish different components, elements, parts, sections or assemblies of different levels. However, if other words may achieve the same purpose, the words may be replaced by other expressions.

As used in the disclosure and the appended claims, the singular forms "an," and "the" include plural referents unless the content clearly dictates otherwise. In general, the terms "comprise," "comprises," and/or "comprising," "include," "includes," and/or "including" merely prompt to include steps and elements that have been clearly identified, and these steps and elements do not constitute an exclusive listing. The methods or devices may also include other steps or elements.

The flowcharts used in the present disclosure illustrate operations that systems implement according to some embodiments of the present disclosure. It should be noted that the foregoing or the following operations may not be performed in the order accurately. Instead, the steps can be processed in reverse order or simultaneously. Besides, one or more other operations may be added to the flow charts, or one or more operations may be omitted from the flow chart.

Some embodiments of the present disclosure provide a temperature field device. The temperature field device may include a bottom plate, a cover plate, a drum, and a filler. The bottom plate may be mounted on a bottom of the temperature field device and cover an open end of the drum. The cover plate may be mounted on a top of the temperature field device and cover the other open end of the drum. The filler may be filled inside the drum.

The bottom plate may be mounted on the bottom of the temperature field device and may be configured to support other components (e.g., the drum and/or the filler) of the temperature field device. In some embodiments, the bottom plate may be made of a heat-reflective material with a relatively high reflection coefficient, such as gold, silver, nickel, aluminum foil, copper, molybdenum, coated metal, stainless steel, etc. Preferably, the bottom plate may be made of copper. Since the temperature field device is placed inside a furnace body of a single crystal growth furnace when the temperature field device is in use, the bottom plate may be placed or mounted on a mounting plate of the furnace body. A manner of placing or mounting the bottom plate may include a welding connection, a riveting connection, a bolt connection, a bonding connection, etc. When the temperature field device is in use, the internal temperature may reach a relatively high temperature, for example, 1900° C. Therefore, it is necessary to reduce heat radiation of the temperature field device to prevent the furnace body from being damaged by excessive heat. Accordingly, the bottom plate may be provided with circulating coolant channel(s), through which a circulating coolant may pass to absorb the heat inside the temperature field device, thereby insulating the heat and reducing the heat radiation. The circulating coolant channel(s) may be mounted inside the bottom plate with a spiral shape or a snake shape. A cooling manner may include liquid cooling, wind cooling, air cooling, or other manner that can achieve cooling purpose. When the liquid cooling is used, a coolant may include water, ethanol, ethylene glycol, isopropanol, n-hexane, or the like, or any combination thereof. For example, the coolant may include a 50:50 mixed liquid of water and ethanol. A count of the circulating coolant channel(s) may be one or more, for example, 1 to 3.

The drum may be mounted on the bottom plate and constitute an outer wall of the temperature field device. The bottom plate may cover an open end of the drum. The drum may be mounted on the bottom plate to support the temperature field device. The drum may be mounted on the bottom plate by a welding connection, a riveting connection, a bolt connection, a bonding connection, etc. Meanwhile, the drum may be used to achieve the sealing and the heat preservation of the temperature field device together with other components (e.g., the bottom plate, the first cover plate) of the temperature field device. In some embodiments, the drum may be made of a material with relatively good heat resistance to maintain temperature stable during crystal growth. The drum may be made of zirconia, alumina, silica, graphite, ceramics, or other heat resistant materials.

The filler may be filled inside the drum for heat preservation. The filler may buffer the sudden temperature change which occurs inside the temperature field device (e.g., a communication between the temperature field device and the external environment caused by a cracking of the drum). In some embodiments, the filler may include a granule shaped material, a brick shaped material, and/or a felt shaped material. The filler may be made of a heat resistant material. For example, the heat resistant material may include a zircon sand (a zirconium silicate compound), a zirconia particle, an alumina particle, a zirconia felt, a zirconia brick, an alumina brick, etc. The filler may also include a mixture of substances with a shape of particle, a shape of felt, or a shape of brick.

The cover plate may be mounted on a top of the temperature field device and be configured to seal the temperature field device together with other components, (e.g., the drum and the bottom plate). The cover plate may cover the other open end of the drum and may be connected to the drum by a welding connection, a riveting connection, a bolt connection, a bonding connection, etc. For example, a silicone sealing ring may be used at a joint between the cover plate and the drum, and a screw may be used to screw and seal the cover plate and the drum. In some embodiments, a material of the cover plate may be similar to that of the bottom plate. The cover plate may be made of a heat-reflective material with a relatively high reflection coefficient, such as gold, silver, nickel, aluminum foil, copper, molybdenum, coated metal, stainless steel, etc. Preferably, the cover plate may be a copper plate. In some embodiments, the cover plate may include at least one first through hole. The at least one first through hole may be configured to pass a gas through. For example, the at least one first through hole may constitute a channel for the gas to enter into and exit from the temperature field device. The gas may be introduced into the first temperature field through the at least one first through hole and be discharged from the temperature field device through the at least one first through hole. In some embodiments, an observation unit may be mounted above the first through hole. The observation unit may include a chamber connected with the first through hole and a second through hole connected with the chamber. The second through hole may be configured to pass the gas through. The observation unit may also include an observation window. In some embodiments, the cover plate may further include a third through hole for a pulling rod to enter into and exit from the temperature field device. Meanwhile, the gas may also be discharged through the third through hole.

FIG. 1 is a schematic diagram illustrating an exemplary temperature field device according to some embodiments of the present disclosure. It should be noted that FIG. 1 is provided for illustration purposes and does not limit the specific shape and structure of the temperature field device. The temperature field device 100 may be placed in a crystal growth furnace to provide temperature gradient required for crystal growth and ensure the stability of a crystal crystallization process. The temperature field device 100 may be cylindrical or have other pillar shapes, such as a polygonal prism. The external structure of the temperature field device 100 may generally consist of a first hollow pillar and two cover plates which covers two ends of the first hollow pillar. Specifically, the two cover plates may be connected to the two ends of the first hollow pillar in a connection manner such as a bonding connection, a welding connection, a riveting connection, a key connection, a bolt connection, a buckle connection, etc. Alternatively, one end of the first hollow pillar may be connected to one cover plate (e.g., by a detachable connection), and the other end of the first hollow pillar may be integrally formed with or non-detachably connected to another cover plate. Inside the hollow pillar, a second hollow pillar with a height less than the first hollow pillar can be set. A space between the first hollow pillar and the second hollow pillar, and/or a space inside the second hollow pillar may be filled with a substance for heat preservation. For example, the space between the first hollow pillar and the second hollow pillar may be filled with a substance for heat preservation, and the space inside the second hollow pillar may also be filled with a substance for heat preservation. As another example, the space between the first hollow pillar and the second hollow pillar may be filled with a substance for heat preservation, while the space inside the second hollow pillar may not be filled with a substance for heat preservation. As still another example, the space between the first hollow pillar and the second hollow pillar may not be filled with a substance for heat preservation, and the space inside the second hollow pillar may be filled with a substance for heat preservation. Meanwhile, the substance filled in the second hollow pillar may also support a crucible for placing reactants. Besides, an end of the second hollow pillar near a top of the first hollow pillar may be connected to an insulation board to further enhance the insulation effect.

As shown in FIG. 1, the temperature field device 100 may include a bottom plate 102, a first drum 104, a second drum 106, a filler 108, a first cover plate 110, a second cover plate 112, an observation unit 118, a sealing ring 120, a pressure ring 122, and a gas channel 124. When the temperature field device 100 is in use, the temperature field device 100 may be placed in the crystal growth furnace. Specifically, the temperature filed device 100 may be placed in the induction coil 116 in the furnace, and a crucible 114 may be placed inside the temperature field device 100.

The bottom plate 102 may be mounted on a bottom of the temperature field device 100 to support other components (e.g., the first drum 104, the second drum 106, and/or filler 108) of the temperature field device 100. In some embodiments, a material of the bottom plate 102 may include a heat-reflective material with a relatively high reflection coefficient, such as gold, silver, nickel, aluminum foil, copper, molybdenum, coated metal, stainless steel, etc. Preferably, the material of the bottom plate 102 may be copper. In some embodiments, a diameter of the bottom plate 102 may be 200 mm~500 mm. More preferably, the diameter of the bottom plate 102 may be 250 mm~450 mm. More preferably, the diameter of the bottom plate 102 may be 300 mm~400 mm. More preferably, the diameter of the bottom plate 102 may be 310 mm~390 mm. More preferably, the diameter of the bottom plate 102 may be 320 mm~380 mm. More preferably, the diameter of the bottom plate 102 may be 330 mm~370 mm. More preferably, the diameter of the bottom plate 102 may be 340 mm~360 mm. In some embodiments, a thickness of the bottom plate 102 may be 10 mm~40 mm. More preferably, the thickness of the bottom plate 102 may be 15 mm~35 mm. More preferably, the thickness of the bottom plate 102 may be 20 mm~30 mm. More preferably, the thickness of the bottom plate 102 may be 21 mm~29 mm. More preferably, the thickness of the bottom plate 102 may be 22 mm~28 mm.

More preferably, the thickness of the bottom plate 102 may be 23 mm~27 mm. More preferably, the thickness of the bottom plate 102 may be 24 mm~26 mm. Since the temperature field device 100 may be placed inside a furnace body of a single crystal growth furnace when the temperature field device 100 is in use, the bottom plate 102 may be placed or mounted on a mounting plate of the furnace body. A manner of placing or mounting the bottom plate 102 may include a welding connection, a riveting connection, a bolt connection, a bonding connection, etc. When the bottom plate 102 is being mounted, a level requirement of the bottom plate 102 may be less than 0.5 mm/m. mm/m may refer to a height difference (mm) between two ends of a unit length (m). Preferably, the level requirement of the bottom plate 102 may be less than 0.4 mm/m. More preferably, the level requirement of the bottom plate 102 may be less than 0.3 mm/m. More preferably, the level requirement of the bottom plate 102 may be less than 0.2 mm/m. More preferably, the level requirement of the bottom plate 102 may be less than 0.1 mm/m. More preferably, the level requirement of the bottom plate 102 may be less than 0.09 mm/m. More preferably, the level requirement of the bottom plate 102 may be less than 0.08 mm/m. More preferably, the level requirement of the bottom plate 102 may be less than 0.07 mm/m. More preferably, the level requirement of the bottom plate 102 may be less than 0.06 mm/m. More preferably, the level requirement of the bottom plate 102 may be less than 0.05 mm/m. More preferably, the level requirement of the bottom plate 102 may be less than 0.04 mm/m, More preferably, the level requirement of the bottom plate 102 may be less than 0.03 mm/m. More preferably, the level requirement of the bottom plate 102 may be less than 0.02 mm/m. More preferably, the level requirement of the bottom plate 102 may be less than 0.01 mm/m. When the temperature field device 100 is in use, an internal temperature may reach a relatively high temperature, for example, 1900° C. Therefore, it is necessary to reduce heat radiation of the temperature field device 100 to prevent the furnace body from being damaged by receiving excessive heat. In this case, the bottom plate 102 may be provided with circulating coolant channel(s), through which a circulating cooling coolant may pass to absorb the heat inside the temperature field device 200, thereby insulating the heat and reducing the heat radiation. The circulating coolant channel(s) may be mounted inside the bottom plate 102 with a spiral shape or a snake shape. A cooling manner may include liquid cooling, wind cooling, gas cooling, or other manner that can achieve cooling purpose. When the liquid cooling is used, a coolant may include water, ethanol, ethylene glycol, isopropanol, n-hexane, or the like, or any combination thereof. For example, the coolant may include a 50:50 mixed liquid of water and ethanol. The coolant may also include cooling oil. A count of the circulating coolant channel(s) may be one or more, for example, 1 to 3. In some embodiments, diameter(s) of the circulating coolant channel(s) may be 5 mm~25 mm. Preferably, the channel diameter(s) of the circulating coolant channel(s) may be 10 mm~20 mm. Preferably, the channel diameter(s) of the circulating coolant channel(s) may be 11 mm~19 mm. Preferably, the channel diameter(s) of the circulating coolant channel(s) may be 12 mm~18 mm. Preferably, the channel diameter(s) of the circulating coolant channel(s) may be 13 mm~17 mm. Preferably, the channel diameter(s) of the circulating coolant channel(s) may be 14 mm~15 mm.

The first drum 104 may be mounted on the bottom plate 102 and constitute an outer wall of the temperature field device 100. The bottom plate 102 may cover an open end of the first drum 104. The first drum 104 may be mounted on the bottom plate 102 to support the temperature field device 100. The first drum may be mounted on the bottom plate 102 by a welding connection, a riveting connection, a bolt connection, a bonding connection, etc. Meanwhile, the first drum 104 may be used to achieve the sealing and the heat preservation of the temperature field device 200 together with other components (e.g., the bottom plate 102, the first cover plate 112) of the temperature field device 100. When the first drum 104 is being mounted, a concentricity of the first drum 104 and the bottom plate 102 may be less than 1 mm. More preferably, the concentricity of the first drum 104 and the bottom plate 102 may be less than 0.9 mm. More preferably, the concentricity of the first drum 104 and the bottom plate 102 may be less than 0.8 mm. More preferably, the concentricity of the first drum 104 and the bottom plate 102 may be less than 0.7 mm. More preferably, the concentricity of the first drum 104 and the bottom plate 102 may be less than 0.6 mm. More preferably, the concentricity of the first drum 104 and the bottom plate 102 may be less than 0.5 mm. More preferably, the concentricity of the first drum 104 and the bottom plate 102 may be less than 0.4 mm. More preferably, the concentricity of the first drum 104 and the bottom plate 102 may be less than 0.3 mm. More preferably, the concentricity of the first drum 104 and the bottom plate 102 may be less than 0.2 mm. More preferably, the concentricity of the first drum 104 and the bottom plate 102 may be less than 0.1 mm. A perpendicularity between the first drum 104 and the bottom plate 102 may be less than 0.2 degrees. More preferably, the perpendicularity of the first drum 104 and the bottom plate 102 may be less than 0.15 degrees. More preferably, the perpendicularity of the first drum 104 and the bottom plate 102 may be less than 0.1 degrees. More preferably, the perpendicularity of the first drum 104 and the bottom plate 102 may be less than 0.05 degrees. More preferably, the perpendicularity of the first drum 104 and the bottom plate 102 may be less than 0.03 degrees. In some embodiments, the first drum 104 may be made of quartz (silicon oxide), corundum (alumina), zirconium oxide, graphite, carbon fiber, ceramics, etc., or other heat resistant materials such as boride, carbide, nitride, silicide, phosphide, sulfide, etc. of rare earth metals. Preferably, the first drum 104 may be a quartz tube or a corundum tube. According to a size of the bottom plate 102, an inner diameter of the first drum 104 may be 180 mm~450 mm. More preferably, the inner diameter of the first drum 104 may be 200 mm~430 mm. More preferably, the inner diameter of the first drum 104 may be 220 mm~410 mm. More preferably, the inner diameter of the first drum 104 may be 250 mm~380 mm. More preferably, the inner diameter of the first drum 104 may be 270 mm~360 mm. More preferably, the inner diameter of the first drum 104 may be 300 mm~330 mm. Preferably, the inner diameter of the first drum 104 may be 310 mm~320 mm. In some embodiments, a thickness of the first drum 104 may be 1 mm~15 mm. More preferably, the thickness of the first drum 104 may be 3 mm~12 mm. More preferably, the thickness of the first drum 104 may be mm~10 mm. More preferably, the thickness of the first drum 104 may be 6 mm~9 mm. More preferably, the thickness of the first drum 104 may be 7 mm~8 mm. A height of the first drum 104 may be 600 mm~1600 mm. More preferably, the height of the first drum 104 may be 700 mm~1500 mm. More preferably, the height of the first drum 104 may be 800 mm~1400 mm. More preferably, the height of the first drum 104 may be 900 mm~1300 mm. More preferably, the height of the first drum 104 may be 1000 mm~1200 mm. More preferably, the height of the first drum 104 may be 1050 mm~1150 mm. More preferably, the height of the first drum 104 may be 1060 mm~1140 mm. More preferably, the height of the first drum 104 may be 1070 mm~1130 mm. More preferably, the height of the first drum 104 may be 1080 mm~1120 mm. More preferably, the height of the first drum 104 may be 1090 mm~1110 mm. More preferably, the height of the first drum 104 may be 1095 mm~1105 mm.

The second drum 106 may be mounted inside the first drum 104. In some embodiments, the second drum 106 may be made of a material with a relatively good heat resistance to maintain temperature stable during crystal growth. The second drum 106 may be made of silicon oxide, zirconium oxide, aluminum oxide, graphite, ceramics, etc. Preferably, the second drum 106 may be a zirconium tube made of zirconia. To match the size of the first drum 104, an inner diameter of the second drum 106 may be 70-300 mm. More preferably, the inner diameter of the second drum 106 may be 100 mm~270 mm. More preferably, the inner diameter of the second drum 106 may be 120 mm~250 mm. More preferably, the inner diameter of the second drum 106 may be 150 mm~220 mm. More preferably, the inner diameter of the second drum 106 may be 170 mm~200 mm. More preferably, the inner diameter of the second drum 106 may be 180 mm~270 mm. A thickness of the second drum 106 may be 8 mm~30 mm. More preferably, the thickness of the second drum 106 may be 10 mm~30 mm. More preferably, the thickness of the second drum 106 may be 15 mm~25 mm. More preferably, the thickness of the second drum 106 may be 16 mm~24 mm. More preferably, the thickness of the second drum 106 may be 17 mm~23 mm. More preferably, the thickness of the second drum 106 may be 18 mm~22 mm. More preferably, the thickness of the second drum 106 may be 19 mm~21 mm. In some embodiments, one end of the second drum 106 may be placed or mounted on the bottom plate 102, for example, by a bonding connection, a welding connection, a riveting connection, a key connection, a bolt connection, a buckle connection, etc. When the second drum 106 is being mounted, a concentricity of the second drum 106 and the bottom plate 102 may be less than 1 mm. More preferably, the concentricity of the second drum 106 and the bottom plate 102 may be less than 0.9 mm. More preferably, the concentricity of the second drum 106 and the bottom plate 102 may be less than 0.8 mm. More preferably, the concentricity of the second drum 106 and the bottom plate 102 may be less than 0.7 mm. More preferably, the concentricity of the second drum 106 and the bottom plate 102 may be less than 0.6 mm. More preferably, the concentricity of the second drum 106 and the bottom plate 102 may be less than 0.5 mm. More preferably, the concentricity of the second drum 106 and the bottom plate 102 may be less than 0.4 mm. More preferably, the concentricity of the second drum 106 and the bottom plate 102 may be less than 0.3 mm. More preferably, the concentricity of the second drum 106 and the bottom plate 102 may be less than 0.2 mm. More preferably, the concentricity of the second drum 106 and the bottom plate 102 may be less than 0.1 mm. More preferably, the concentricity of the second drum 106 and the bottom plate 102 may be less than 0.05 mm. Meanwhile, a perpendicularity of the second drum 106 may be less than 0.2 degrees. More preferably, the perpendicularity of the second drum 106 may be less than 0.15 degrees. More preferably, the perpendicularity of the second drum 106 may be less than 0.1 degrees. More preferably, the perpendicularity of the second drum 106 may be less than 0.08 degrees. More preferably, the perpendicularity of the second drum 106 may be less than 0.05 degrees. In some embodiments, when the second drum 106 is mounted on the bottom plate 102, according to different lengths, the second drum 106 may be in different mounting states. When a length of the second drum 106 is the same as that of the first drum 104, a mounting state of the second drum 106 may be similar to that of the first drum 104, that is, one open end of the second drum 106 may be connected to the bottom plate 102 and the other open end connected to the first cover plate 110. When the length of the second drum 106 is smaller than the first drum 104, the other open end of the second drum 106 may be connected to other components (e.g., the second cover plate 112) of the temperature field device 100. The second cover plate 112 may cover the other open end of the second drum 106. Meanwhile, a size and/or a shape of the second cover plate 112 (e.g., a diameter of a circle cover plate) may be matched with a cross-section of the first drum 104 to achieve a seamless connection with the first drum 104. In some embodiments, the second cartridge 206 may not be mounted on the bottom plate 102. When the length of the second drum 106 is smaller than that of the first drum 104, one end of the second drum 106 may be mounted on other components (e.g., the first cover plate 110 and the second cover plate 112) of the temperature field device 100. The other end of the second drum 106 may be kept at a certain distance from the bottom plate 102 (e.g., in a floating state). In some embodiments, the length of the second drum 106 may be consistent with that of the first drum 104. In some embodiments, the length of the second drum 106 may be 500 mm~1500 mm. More preferably, the length of the second drum 106 may be 600 mm~1400 mm. More preferably, the length of the second drum 106 may be 700 mm~1300 mm. More preferably, the length of the second drum 106 may be 800 mm~1200 mm. More preferably, the length of the second drum 106 may be 900 mm~1100 mm. More preferably, the length of the second drum 106 may be 950 mm~1050 mm. More preferably, the length of the second drum 106 may be 960 mm~1040 mm. More preferably, the length of the second drum 106 may be 970 mm~1030 mm. More preferably, the length of the second drum 106 may be 980 mm~1020 mm. More preferably, the length of the second drum 106 may be 990 mm~1010 mm.

The filler 108 may be filled in the second drum 106, and/or a space between the first drum 104 and the second drum 106. The filler 108 may be configured for heat preservation. In some embodiments, a thickness, a height, and/or a tightness of the filler 108 may change a position of a component (e.g., the crucible 114) supported by the filler 108 supports, a space volume of the heat dissipation in the temperature field device 100, and/or a temperature gradient required for crystal growth. By changing the thickness, the height and/or the tightness of the filler 108, different stable temperature gradients may be obtained to meet different crystal growth requirements. Meanwhile, when the second drum 106 cracks, the filler 108 filled in the space between the first drum 104 and the second drum 106 may act as a thermal insulation layer to prevent a change caused by a communication between the temperature field device 100 and the external environment, which may affect the crystal growth. The thermal insulation layer formed by the filler 108 may maintain the temperature gradient in the temperature field device 100 in the above-mentioned case to avoid the sudden change of the temperature. In some embodiments, the filler 108 may also buffer the sudden temperature change when the second drum 106 cracks. In some embodiments, the filler 108 may be made of a heat resistant material, such as silicon oxide, aluminum oxide, zirconium oxide, graphite, carbon fiber, ceramics, and boride, carbide, nitride, silicide, phosphide, sulfide, etc. of rare-earth metals, etc. In some embodiments, the filler 108 may include a substance with a shape of granule (e.g., a zircon sand (a zirconium silicate compound), a zirconia particle, an alumina particle). A particle size of the filler 108 may be 5 mesh~200 mesh. More preferably, the particle size of the filler 108 may be 10 mesh~190 mesh. More preferably, the particle size of the filler 108 may be 20 mesh~180 mesh. More preferably, the particle size of the filler 108 may be 30 mesh~170 mesh. More preferably, the particle size of the filler 108 may be 40 mesh~160 mesh. More preferably, the particle size of the filler 108 may be 50 mesh~150 mesh. More preferably, the particle size of the filler 108 may be 60 mesh~140 mesh. More preferably, the particle size of the filler 108 may be 70 mesh~130 mesh. More preferably, the particle size of the filler 108 may be 80 mesh~120 mesh. More preferably, the particle size of the filler 108 may be 90 mesh~110 mesh. More preferably, the particle size of the filler 108 may be 95 mesh~105 mesh. In some embodiments, the filler 108 may include a substance with a shape of felt (e.g., a zirconia felt). In some embodiments, the filler 108 may include a substance with a shape of brick (e.g., a zirconia brick, and/or an alumina brick). In some embodiments, the filler 108 may include a mixture of any two or more of a substance with a shape of granule, a shape of brick, or a shape of felt. For example, the filler 108 may include a mixture of a zirconia felt with one or more of a zirconia sand, a zirconia particle, an alumina particle, etc.

In some embodiments, the filler 108 filled in the second drum 106 may be configured to support the crucible 114 containing the reactants for crystal growth. The filler 108 may cover a portion of the crucible 114, for example, a bottom and a sidewall of the filler 208. To prevent the filler 108 from falling into the reactants in the crucible 114, an upper edge of the crucible 114 may be higher than the filling height of the filler 108 filled in the second drum 106. On the other hand, the second drum 106 may also prevent the filler 108 filled in the space between the first drum 104 and the second drum 106 from falling into the crucible 114. In some embodiments, the crucible 114 may be made of iridium (Ir), molybdenum (Mo), tungsten (W), rhenium metal (Re), graphite (C), tungsten-molybdenum alloy, etc. Preferably, the crucible 114 may be an iridium crucible, in some embodiments, a diameter of the crucible 114 may be 60 mm~250 mm. More preferably, the diameter of the crucible 114 may be 80 mm~220 mm. More preferably, the diameter of the crucible 114 may be 100 mm~200 mm. More preferably, the diameter of the crucible 114 may be 110 mm~190 mm. More preferably, the diameter of the crucible 114 may be 120 mm~180 mm. More preferably, the diameter of the crucible 114 may be 130 mm~170 mm. More preferably, the diameter of the crucible 114 may be 140 mm~160 mm. More preferably, the diameter of the crucible 114 may be 145 mm~155 mm. A thickness of the crucible 114 may be 2 mm~4 mm. More preferably, the thickness of the crucible 114 may be 2.2 mm~3.8 mm. More preferably, the thickness of the crucible 114 may be 2.5 mm~3.5 mm. More preferably, the thickness of the crucible 114 may be 2.6 mm~3.4 mm. More preferably, the thickness of the crucible 114 may be 2.7 mm~3.3 mm. More preferably, the thickness of the crucible 114 may be 2.8 mm~3.2 mm. More preferably, the thickness of the crucible 114 may be 2.9 mm~3.1 mm. A height of the crucible 114 may be 60 mm~250 mm. More preferably, the height of the crucible 114 may be 80 mm~220 mm. More preferably, the height of the crucible 114 may be 100 mm~200 mm. More preferably, the height of the crucible 114 may be 110 mm~190 mm. More preferably, the height of the crucible 114 may be 120 mm~180 mm. More preferably, the height of the crucible 114 may be 130 mm~170 mm. More preferably, the height of the crucible 114 may be 140 mm~160 mm. More preferably, the height of the crucible 114 may be 145 mm~155 mm.

Figure 2:
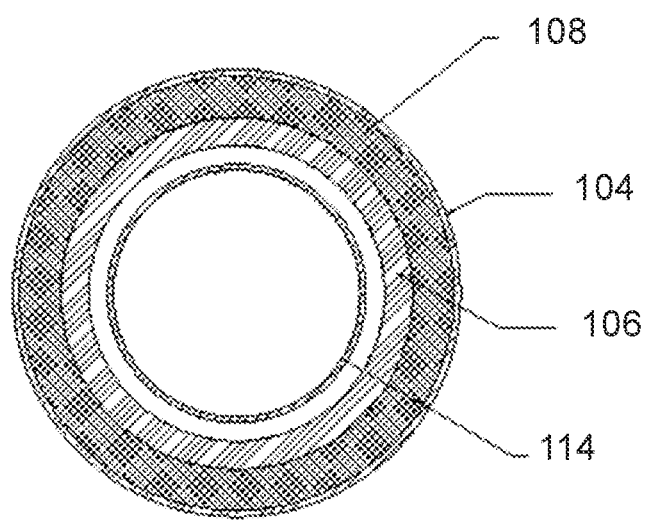
FIG. 2 is a schematic diagram illustrating a top view of an exemplary temperature field device according to some embodiments of the present disclosure.

FIG. 2 is a schematic diagram illustrating a top view of a cross-section of an exemplary temperature field device according to some embodiments of the present disclosure. As shown in FIG. 2, a periphery of the temperature field device 100 may be the first drum 104. The space between the second drum 106 and the first drum 104 may be filled with the filler 108. The crucible 114 may be placed in the second drum 106 and supported by the filler 108 filled on a bottom of the second drum 106. It can be seen that, from outside to inside, components of the temperature field device 100 may successively include the first drum 104, the filler 108, the second drum 106, and the crucible 114. Meanwhile, the above-mentioned four components may form a concentric circle, and a concentricity may be less than 1 mm. More preferably, the concentricity may be less than 0.9 mm. More preferably, the concentricity may be less than 0.8 mm. More preferably, the concentricity may be less than 0.7 mm. More preferably, the concentricity may be less than 0.6 mm. More preferably, the concentricity may be less than 0.5 mm. More preferably, the concentricity may be less than 0.4 mm. More preferably, the concentricity may be less than 0.3 mm. More preferably, the concentricity may be less than 0.2 mm. More preferably, the concentricity may be less than 0.1 mm. The formed concentric circle may be beneficial for growing crystals, observing the crystal growth, introducing flowing gas, and pulling up the crystals.

In some embodiments, the crucible 114 may be used as a heater to melt the reactants contained therein to facilitate subsequent crystal growth. An induction coil (e.g., the induction coil 116 illustrated in FIG. 11) surrounding the outer wall of the first drum 104 may generate an alternating magnetic field when an alternating current with a certain frequency is passed. A closed induced current (i.e., an eddy current) may be generated in a conductor (e.g., the crucible 114) caused by the electromagnetic induction of the alternating magnetic field. The induced current may be unevenly distributed on a cross-section of the conductor and the electrical energy of a high-density current on a surface of the conductor may be converted into heat energy to increase the temperature of the conductor to melt the reactants. The induction coil 116 may include a coil with 7 turns~12 turns. More preferably, the induction coil 116 may include a coil with 8 turns~11 turns. More preferably, the induction coil 116 may include a coil with 9 turns~10 turns. An induction frequency thereof may be 2 kHz~15 kHz. More preferably, the induction frequency may be 3 kHz~14 kHz. More preferably, the induction frequency may be 4 kHz~13 kHz. More preferably, the induction frequency may be 5 kHz~12 kHz. More preferably, the induction frequency may be 6 kHz~11 kHz. More preferably, the induction frequency may be 7 kHz~10 kHz. More preferably, the induction frequency may be 8 kHz~9 kHz. In some embodiments, the filling height of the filler 108 may result in that a vertical distance between an upper edge of the crucible 114 and an upper edge of the induction coil 116 is 0 mm~∓50 mm (i.e., −50~50 mm), wherein, "−" represents that the upper edge of the crucible 114 is lower than the upper edge of the induction coil 116, and "+" represents that the upper edge of the crucible 114 is higher than the upper edge of the induction coil 116. More preferably, the vertical distance between the upper edge of the crucible 114 and the upper edge of the induction coil 116 may be −5 mm~+45 mm. More preferably, the vertical distance between the upper edge of the crucible 114 and the upper edge of the induction coil 116 may be −40 mm~+40 mm. More preferably, the vertical distance between the upper edge of the crucible 114 and the upper edge of the induction coil 116 may be −35 mm~+35 mm. More preferably, the vertical distance between the upper edge of the crucible 114 and the upper edge of the induction coil 116 may be −30 mm~+30 mm. More preferably, the vertical distance between the upper edge of the crucible 114 and the upper edge of the induction coil 116 may be −25 mm~+25 mm. The temperature gradient of the temperature field device 100 can be adjusted by changing a relative position between the crucible 114 and the induction coil 116. For example, when the crucible 114 is totally within the coil range of the induction coil 116, the heat generated by the crucible 114 may be relatively large; whereas, when only a portion of the crucible 114 is in the coil range of the induction coil 116, the heat generated by the crucible 114 may be relatively small, accordingly, the heat position and/or a space size of heat dissipation in the temperature field device 100 may be determined, and the temperature gradient may be further affected.

The first cover plate 110 may be mounted on a top of the temperature field device 100, and may be used to seal the temperature field device 100 together with other components (e.g., the first drum 104). The first cover plate 110 may cover the other open end of the first drum 104. The first cover plate 110 may be connected to the first drum 104 by a welding connection, a riveting connection, a bolt connection, a bonding connection, etc. For example, a silicone sealing ring may be used at a joint between the first cover plate 110 and the first drum 104, and a screw may be used to screw and seal the first cover plate 110 and the first drum 104. In some embodiments, a material of the first cover plate 110 may be similar to that of the bottom plate 102. The first cover plate 110 may be made of a heat-reflective material with a relatively high reflection coefficient, such as gold, silver, nickel, aluminum foil, copper, molybdenum, coated metal, stainless steel, etc. Preferably, the first cover plate 110 may be a copper plate. When the first cover plate 110 is being mounted, a concentricity of the first cover plate 110 and the first drum 104 may be less than 0.5 mm. More preferably, the concentricity of the first cover plate 110 and the first drum 104 may be less than 0.4 mm. More preferably, the concentricity of the first cover plate 110 and the first drum 104 may be less than 0.3 mm. More preferably, the concentricity of the first cover plate 110 and the first drum 104 may be less than 0.2 mm. More preferably, the concentricity of the first cover plate 110 and the first drum 104 may be less than 0.1 mm. In some embodiments, a diameter of the first cover plate 110 may be 200 mm~500 mm. More preferably, the diameter of the first cover plate 110 may be 250-450 mm. More preferably, the diameter of the first cover plate 110 may be 300 mm~400 mm. More preferably, the diameter of the first cover plate 110 may be 310 mm~390 mm. More preferably, the diameter of the first cover plate 110 may be 320 mm~380 mm. More preferably, the diameter of the first cover plate 110 may be 330 mm~370 mm. More preferably, the diameter of the first cover plate 110 may be 340 mm~360 mm. In some embodiments, a thickness of the first cover plate 110 may be 10 mm~40 mm. More preferably, the thickness of the first cover plate 110 may be 15 mm~35 mm. More preferably, the thickness of the first cover plate 110 may be 20 mm~30 mm. More preferably, the thickness of the first cover plate 110 may be 21 mm~29 mm. More preferably, the thickness of the first cover plate 110 may be 22 mm~28 mm. More preferably, the thickness of the first cover plate 110 may be 23 mm~27 mm. More preferably, the thickness of the first cover plate 110 may be 24 mm~26 mm. In some embodiments, the first cover plate 110 may include at least one first through hole. The at least one first through hole may be configured to pass a gas through. For example, the at least one first through hole may constitute a channel for the gas to enter into and/or exit from the temperature field device 100. The gas maybe introduced into the temperature field device 100 through the at least one first through hole and be discharged from the temperature field device 100 through remaining first through hole(s) or the first through hole(s) through which the gas is introduced. In some embodiments, the gas may include one or more of oxygen and/or inert gas(es). The inert gas(es) may include nitrogen, helium, neon, argon, krypton, xenon, radon, etc. In some embodiments, the gas may be a combination of oxygen and one or more inert gases. In some embodiments, the gas may be a mixed gas of hydrogen and/or carbon monoxide with one or more inert gases. In some embodiments, the gas may include one or more of nitrogen, argon, oxygen, and carbon monoxide. According to characteristics and a size of the crystal to be grown, a flow rate of the gas introduced into the temperature field device 100 may be 0.01 L/min~50 L/min. More preferably, the flow rate of the introduced gas may be 0.01 L/min~50 L/min. More preferably, the flow rate of the introduced gas may be 0.1 L/min~50 L/min. More preferably, the flow rate of the introduced gas may be 1 L/min~50 L/min. More preferably, the flow rate of the introduced gas may be 5 L/min~45/min. More preferably, the flow rate of the introduced gas may be 10 L/min~40 L/min. More preferably, the flow rate of the introduced gas may be 15 L/min~35 L/min. Preferably, the flow rate of the introduced gas may be 20 L/min~30 L/min. More preferably, the flow rate of the introduced gas may be 21 L/min~29 L/min. More preferably, the flow rate of the introduced gas may be 22 L/min~28 L/min. More preferably, the flow rate of the introduced gas may be 23 L/min~27 L/min. More preferably, the flow rate of the introduced gas may be 24 L/min~26 L/min.

Figure 3:
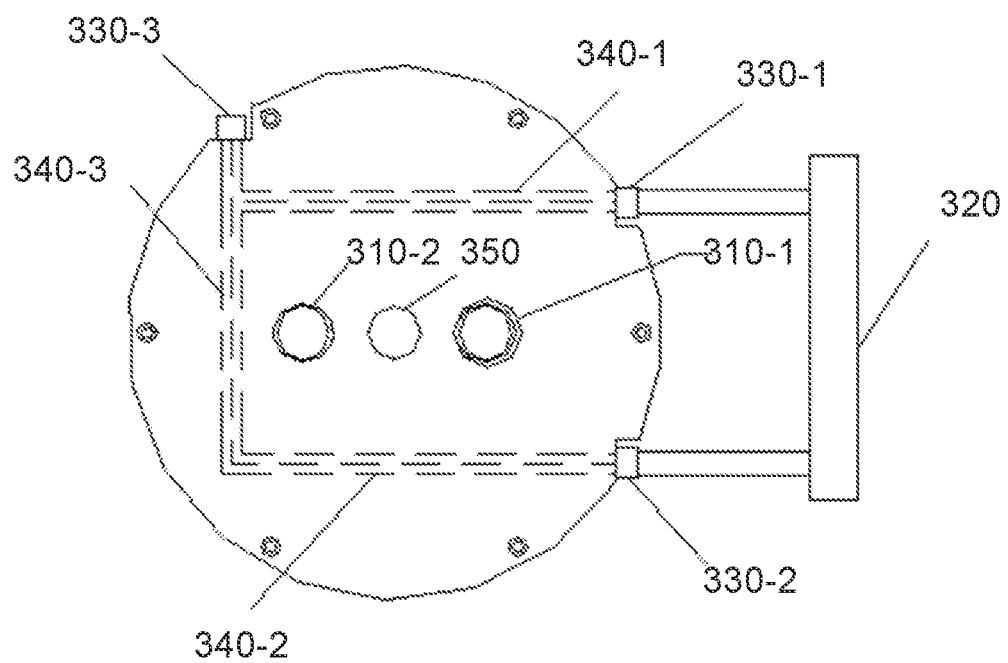
FIG. 3 is a schematic diagram illustrating an exemplary first cover plate according to some embodiments of the present disclosure.

In some embodiments, other components may be mounted on the first cover plate 110. FIG. 3 is a schematic diagram illustrating a top view of an exemplary first cover plate 110 according to some embodiments of the present disclosure. As shown in FIG. 3, the first cover plate 110 may include two first through holes 310-1 and 310-2 through which a gas may enter into and/or exit from the temperature field device 100. In some embodiments, diameters of the first through holes 310-1 and 310-2 may be 15 mm~30 mm. More preferably, the diameters of the first through holes 310-1 and 310-2 may be 18 mm~27 mm. More preferably, the diameters of the first through holes 310-1 and 310-2 may be 20 mm~25 mm. More preferably, the diameters of the first through holes 310-1 and 310-2 may be 21 mm~24 mm. More preferably, the diameters of the first through holes 310-1 and 310-2 may be 22 mm~23 mm. In some embodiments, the rotation central axes of the first through holes 310-1 and 310-2 may be perpendicular to the horizontal plane. In some embodiments, the rotation central axes of the first through holes 310-1 and 310-2 may form angles of 3 degrees~20 degrees with a vertical line of the horizontal plane. More preferably, the rotation central axes of the first through holes 310-1 and 310-2 may form angles of 5 degrees~18 degrees with the vertical line of the horizontal plane. More preferably, the rotation central axes of the first through holes 310-1 and 310-2 may form angles of 7 degrees~15 degrees with the vertical line of the horizontal plane. More preferably, the rotation central axes of the first through holes 310-1 and 310-2 may form angles of 9 degrees~13 degrees with the vertical line of the horizontal plane. More preferably, the rotation central axes of the first through hole 310-1 and 310-2 may form angles of 11 degrees~12 degrees with the vertical line of the horizontal plane. A distance between centers of the two through holes may be 70 mm~150 mm. More preferably, the distance between the centers of two through holes may be 80 mm~140 mm. More preferably, the distance between the centers of two through holes may be 90 mm~130 mm. More preferably, the distance between the centers of two through holes may be 100 mm~120 mm. More preferably, the distance between the centers of two through holes may be 105 mm~115 mm. More preferably, the distance between the centers of two through holes may be 107 mm~113 mm. More preferably, the distance between the centers of two through holes may be 109 mm~111 mm.

Figure 4:
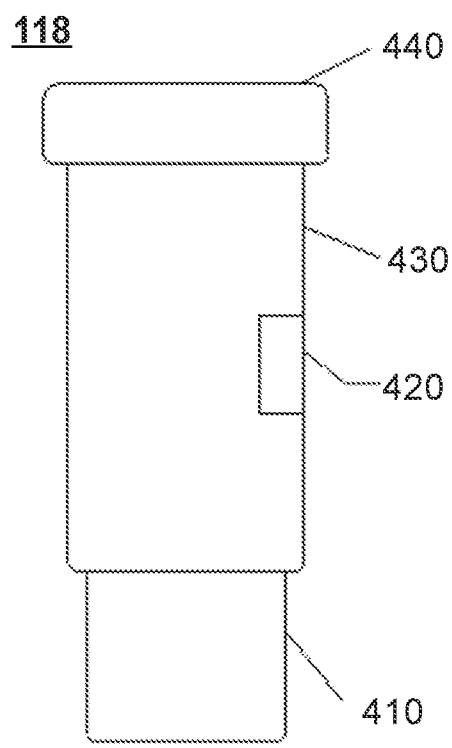
FIG. 4 is a schematic diagram illustrating an exemplary observation unit according to some embodiments of the present disclosure.

In some embodiments, the first through holes 310-1 and 310-2 may be provided with an observation unit 118. Since the crystal growth period is relatively long (which may reach 5-40 days), a unit through which the internal situation of the temperature field device 100 can be observed may be mounted on the temperature field device 100. A user (e.g. a worker in a factory) can observe the growth of the crystal through the observation unit 118. If an abnormal situation is found, timely remedial action can be executed. FIG. 4 is a schematic diagram illustrating an exemplary observation unit 118 according to some embodiments of the present disclosure. The observation unit 118 may be a tubular device with one end closed and one end open. The observation unit 118 may include a first part 410. A size of the first part 410 may be matched with that of the first through hole 310-1/310-2 of the first cover plate 110, thereby realizing a connection between the observation unit 118 and the first cover plate 110, for example, by a riveting connection, a screw connection, etc. Meanwhile, a lower end of the first part 410 may be open, accordingly, after the observation unit 118 is connected with the first cover plate 110, a connection between an inner chamber of the observation unit 118 and the first through hole 310-1/310-2 can be achieved. According to the diameter of the first through hole 310-1/310-2, a diameter of the first part may be 15 mm~30 mm. More preferably, the diameter of the first part 410 may be 18 mm~27 mm. More preferably, the diameter of the first part 410 may be 20 mm~25 mm. More preferably, the diameter of the first part 410 may be 21 mm~24 mm. More preferably, the diameter of the first part 410 may be 22 mm~23 mm. The observation unit 118 may further include a second through hole 420. The second through hole 420 may be opened at any position of a second part 430 of the observation unit 118 and may be connected with the inner chamber of the observation unit 118. After the observation unit 118 is connected to the first through hole 310-1/310-2, the second through hole 420 may be configured to realize the function of gas passing. In some embodiments, a diameter of the second through hole 420 may be 3 mm~10 mm. More preferably, the diameter of the second through hole 420 may be 4 mm~9 mm. More preferably, the diameter of the second through hole 420 may be 5 mm~8 mm. More preferably, the diameter of the second through hole 420 may be 6 mm~7 mm. The second part 430 may be a part that is protruded outside the first cover plate 110 after the observation unit 118 is connected to the first through hole 310-1/310-2, and a height of the second part 430 may be 50 mm~100 mm. More preferably, the height of the second part 430 may be 60 mm~90 mm. Preferably, the height of the second part 430 may be 70 mm~80 mm. More preferably, the height of the second part 430 may be 71 mm~79 mm, More preferably, the height of the second part 430 may be 72 mm~78 mm. More preferably, the height of the second part 430 may be 73 mm~77 mm. More preferably, the height of the second part 430 may be 74 mm~76 mm. In some embodiments, a diameter of the second part 430 may be 26 mm~66 mm. More preferably, the diameter of the second part 430 may be 30 mm~60 mm. More preferably, the diameter of the second part 430 may be 35 mm~55 mm. More preferably, the diameter of the second part 430 may be 40 mm~50 mm. More preferably, the diameter of the second part 430 may be 41 mm~49 mm. More preferably, the diameter of the second part 430 may be 42 mm~48 mm. More preferably, the diameter of the second part 430 may be 43 mm~47 mm. More preferably, the diameter of the second part 430 may be 44 mm~46 mm. The observation unit 118 may further include an observation window 440. The observation window 440 may be mounted on a top of the observation unit 118, and be made of a transparent material such as quartz, polymethyl methacrylate (PMMA), polystyrene (PS), polycarbonate (PC), etc. The user (e.g., the worker in the factory) may observe the internal situation of the temperature field device 100 through the observation window 440.

Similarly, in order to reduce heat radiation emitted from the upper of the temperature field device 100, circulating coolant channel(s) may be mounted on the first cover plate 110. Refer back to FIG. 3, as shown in FIG. 3, the first cover plate 110 may include a coolant channel 320. A cooling manner may include liquid cooling, wind cooling, gas cooling, or other manner that can achieve cooling purpose. When the liquid cooling is used, a coolant may flow through the coolant channel 320. The coolant may include water, ethanol, ethylene glycol, isopropanol, n-hexane or the like, or any combination thereof. For example, the coolant may include a 50:50 mixed liquid of water and ethanol. Through the coolant inlets 330-1 and/or 330-2, the coolant may flow into circulating coolant channels 340-1, 340-2, and 340-3 which are mounted inside the first cover plate 110. After t absorbing heat dissipated from the temperature field device 100, the coolant may flow out from a coolant outlet 330-3. The flowed-out coolant may return to the coolant channel 320 through other channels, and a next cycle may be performed. In some embodiments, diameters of the circulating coolant channels 340-1, 340-2, and 340-3 may be 5-25 mm. More preferably, the diameters of the circulating coolant channels 340-1, 340-2, and 340-3 may be 10-20 mm. More preferably, the diameters of the circulating coolant channels 340-1, 340-2, and 340-3 may be 11-19 mm. More preferably, the diameters of the circulating coolant channels 340-1, 340-2, and 340-3 may be 12 mm~18 mm. More preferably, the diameters of the circulating coolant channels 340-1, 340-2, and 340-3 may be 13 mm~17 mm. More preferably, the diameters of the circulating coolant channels 340-1, 340-2, and 340-3 may be 14 mm~15 mm.

In some embodiments, mounted on the first cover plate 110 may further include a third through hole 350. For example, when the crystal growth is executed based on the Czochralski technique, a channel (e.g., the third through hole 350) for a pulling rod to enter into and/or exit from the temperature field device 100 may be mounted on the first cover plate 110. The third through hole 350 may be mounted at the center of the first cover plate 110. A size of the third through hole 350 may be determined based on a size of the pulling rod. In some embodiments, a shape of the third through hole 350 may be various. For example, the shape of the third hole 350 may include a regular shape such as a circle, a square, a rectangle, a diamond, a regular triangle, or any other irregular shape. In some embodiments, an area of the third through hole 350 may be 100 mm²~3000 mm². More preferably, the area of the third through hole 350 may be 200 mm²~2900 mm². More preferably, the area of the third through hole 350 may be 300 mm²~2800 mm². More preferably, the area of the third through hole 350 may be 400 mm²~2700 mm². More preferably, the area of the third through hole 350 may be 500 mm²~2600 mm². More preferably, the area of the third through hole 350 may be 600 mm²~2500 mm². More preferably, the area of the third through hole 350 may be 700 mm²~2400 mm². More preferably, the area of the third through hole 350 may be 800 mm²~2300 mm². More preferably, the area of the third through hole 350 may be 900 mm²~2200 mm². More preferably, the area of the third through hole 350 may be 1000 mm²~2100 mm². More preferably, the area of the third through hole 350 may be 1100 mm²~2000 mm². More preferably, the area of the third through hole 350 may be 1200 mm²~1900 mm². More preferably, the area of the third through hole 350 may be 1300 mm²~1800 mm². More preferably, the area of the third through hole 350 may be 1400 mm²~1700 mm². More preferably, the area of the third through hole 350 may be 1500 mm²~1600 mm². When the third through hole 350 is a circular through hole, its diameter may be 25-30 mm. More preferably, the diameter thereof may be 26 mm~29 mm. More preferably, the diameter thereof may be 27 mm~28 mm.

The second cover plate 112 may be mounted inside the first drum 104, cover the open end of the second drum 106 near to the first cover plate 110, and be connected to the second drum 106 by a welding connection, a riveting connection, a bolt connection, a bonding connection, etc. In some embodiments, the second cover plate 112 may be made of a material with a relatively good heat preservation performance to achieve heat preservation and thermal insulation functions. The second cover plate 112 may be an alumina plate, a zirconia plate, a ceramic plate, a metal plate, etc., or a plate made of other heat resistant material such as boride, carbide, nitride, silicide, phosphide, sulfide, etc. of rare earth metals. In some embodiments, a diameter of the second cover plate 112 may be determined based on the inner diameter of the first drum 104. The second cover plate 112 may fit the inner wall of the first drum 104. Since one end of the second drum 106 is completely covered, the filler 108 filled between the first drum 104 and the second drum 106 may be prevented from falling out and polluting the reactants in the crucible 114. In order to observe the internal situation of the temperature field device 100 from outside in existence of the second cover plate 212, through holes (also referred to as fourth through holes) corresponding to the through holes (e.g., the first through hole 310-1/310-2, the third through hole 350) on the first cover plate 110 may be opened on the second cover plate 112. The fourth through holes may have same rotation central axes as the first through holes and the third through hole. That is, the fourth through holes may be opened on the second cover plate 212 along the rotation central axes of the first and third through holes. In some embodiments, diameters of the fourth through holes corresponding to the first through hole 310-1/310-2 may be 8 mm~15 mm. More preferably, the diameters of the fourth through holes corresponding to the first through hole 310-1/310-2 may be 9 mm~14 mm. More preferably, the diameters of the fourth through holes corresponding to the first through hole 310-1/310-2 may be 10 mm~13 mm. More preferably, the diameters of the fourth through holes corresponding to the first through hole 310-1/310-2 may be 11 mm~12 mm. Rotation central axes of the fourth through holes corresponding to the first through hole 310-1/310-2 may form angles of 3 degrees~20 degrees with the vertical line of the horizontal plane. More preferably, the rotation central axes of the fourth through holes corresponding to the first through hole 310-1/310-2 may form angles of 5 degrees~18 degrees with the vertical line of the horizontal plane. More preferably, the rotation central axes of the fourth through holes corresponding to the first through hole 310-1/310-2 may form angles of 7 degrees~15 degrees with the vertical line of the horizontal plane. More preferably, the rotation central axes of the fourth through holes corresponding to the first through hole 310-1/310-2 may form angles of 9 degrees~13 degrees with the vertical line of the horizontal plane. More preferably, the rotation central axes of the fourth through holes corresponding to the first through hole 310-1/310-2 may form angles of 11 degrees~12 degrees with the vertical line of the horizontal plane. A distance between centers of the fourth through holes corresponding to the first through hole 310-1/310-2 may be 50 mm~140 mm. More preferably, the distance between the centers of the fourth through holes corresponding to the first through hole 310-1/310-2 may be 60-130 mm. More preferably, the distance between the centers of the fourth through holes corresponding to the first through hole 310-1/310-2 may be 70 mm~120 mm. More preferably, the distance between the centers of the fourth through holes corresponding to the first through hole 310-1/310-2 may be 80 mm~110 mm. More preferably, the distance between the centers of the fourth through holes corresponding to the first through hole 310-1/310-2 may be 90 mm~100 mm. More preferably, the distance between the centers of the fourth through holes corresponding to the first through hole 310-1/310-2 may be 91 mm~99 mm. More preferably, the distance between the centers of the fourth through holes corresponding to the first through hole 310-1/310-2 may be 92 mm~98 mm. More preferably, the distance between the centers of the fourth through holes corresponding to the first through hole 310-1/310-2 may be 93 mm~97 mm. More preferably, the distance between the centers of the fourth through holes corresponding to the first through hole 310-1/310-2 may be 94 mm~96 mm. In some embodiments, the diameter of a fourth through hole corresponding to the third through hole may be 1 mm~150 mm. More preferably, the diameter of the fourth through hole corresponding to the third through hole may be 20 mm~140 mm. More preferably, the diameter of the fourth through hole corresponding to the third through hole may be 30 mm~130 mm. More preferably, the diameter of the fourth through hole corresponding to the third through hole may be 40 mm~120 mm. More preferably, the diameter of the fourth through hole corresponding to the third through hole may be 40 mm~110 mm. More preferably, the diameter of the fourth through hole corresponding to the third through hole may be 60 mm~100 mm. More preferably, the diameter of the fourth through hole corresponding to the third through hole may be 70 mm~90 mm. More preferably, the diameter of the fourth through hole corresponding to the third through hole may be 75 mm~85 mm. The diameter of the fourth through hole corresponding to the third through hole may affect the amount of heat dissipated through the fourth through hole, affecting the temperature gradient of the temperature field device 100. Therefore, by changing the diameter of the fourth through hole corresponding to the third through hole, the temperature gradient of the temperature field device 100 can be adjusted. Meanwhile, an automatic feeder (not shown) may be used at the first through hole 310-1/310-2 and corresponding fourth through holes, which can automatically add reactants to the crucible 114. In this case, a concentration gradient caused by the reactants may be constant during the crystal growth process, which is beneficial to the uniformity and consistency of the crystal growth.

In some embodiments, a thickness of the second cover plate 112 may be 20 mm~35 mm. More preferably, the thickness of the second cover plate 112 may be 25 mm~30 mm. More preferably, the thickness of the second cover plate 112 may be 26 mm~29 mm. More preferably, the thickness of the second cover plate 112 may be 27 mm~28 mm. In some embodiments, a position of the second cover plate 112 in the temperature field device 100 may be determined based on the length and the mounting position of the second drum 106. When the length of the second drum 106 is greater than a length threshold, the second cover plate 112 may be close to the first cover plate 110. A certain distance may be maintained between the second cover plate 112 and the first cover plate 110.

The sealing ring 120 and the pressure ring 122 may achieve a seal between the first drum 104 and the first cover plate 110. In some embodiments, the sealing ring 120 may be mounted on the joint between the first drum 104 and the first cover plate 110. The sealing ring 110 may be made of a material having a certain elasticity, for example, silicone or rubber. An inner diameter of the sealing ring 120 may be less than or equal to the outer diameter of the first drum 214, so that when the sealing ring 120 is mounted, the sealing ring 220 may be stretched to seal effectively the space between the first drum 104 and the first cover plate 110. In some embodiments, the inner diameter of the sealing ring 120 may be 170 mm~440 mm. More preferably, the inner diameter of the sealing ring 120 may be 200 mm~410 mm. More preferably, the inner diameter of the sealing ring 120 may be 250 mm~350 mm. More preferably, the inner diameter of the sealing ring 120 may be 260 mm~340 mm. More preferably, the inner diameter of the sealing ring 120 may be 270 mm~330 mm. More preferably, the inner diameter of the sealing ring 120 may be 280 mm~320 mm. More preferably, the inner diameter of the sealing ring 120 may be 290 mm~310 mm. A wire diameter of the sealing ring 120 may be 5 mm~10 mm. More preferably, the wire diameter of the sealing ring 120 may be 6 mm~9 mm. More preferably, the wire diameter of the sealing ring 120 may be 7 mm~8 mm.

The pressure ring 122 may be configured to perform a fixing and compressing function for the sealing ring 120. In some embodiments, a shape of the pressure ring 122 may be matched with that of the first drum 104, and an inner diameter of the pressure ring 122 may be greater than the outer diameter of the first drum 104. In this case, the pressure ring 122 may be nested on the first drum 104 and may be movable. The pressure ring 122 may include a threaded hole corresponding to the first cover plate 110. When the pressure ring 122 is being mounted, the sealing ring 120 may be mounted between the pressure ring 122 and the first cover plate 110. The pressure ring 122 may be connected to the first cover plate 110 by threads, thereby compressing the sealing ring 120, enlarging a contact surface between the pressure ring 122 and the space between the first drum 104 and the first cover plate 110, causing the contact tight, and achieving the purpose of effective sealing. In some embodiments, other items (e.g., a vacuum grease) may be used to achieve the sealing. When the sealing ring 120 is being mounted, the sealing ring 120 may be covered with the vacuum grease to achieve more effective sealing. In some embodiments, the pressure ring 122 and the first cover plate 110 may also be connected by a buckle connection. In some embodiments, the outer diameter of the pressure ring 122 may be 200 mm~500 mm. More preferably, an outer diameter of the pressure ring 122 may be 250 mm~450 mm. More preferably, the outer diameter of the pressing ring 122 may be 300 mm~400 mm. More preferably, the outer diameter of the pressing ring 122 may be 310 mm~390 mm. More preferably, the outer diameter of the pressing ring 122 may be 320 mm~380 mm. More preferably, the outer diameter of the pressing ring 122 may be 330 mm~370 mm. More preferably, the outer diameter of the pressure ring 122 may be 340 mm~360 mm. More preferably, the outer diameter of the pressing ring 122 may be 345 mm~355 mm. An inner diameter of the pressure ring 122 may be 190 mm~460 mm. More preferably, the inner diameter of the pressure ring 122 may be 220 mm~430 mm. More preferably, the inner diameter of the pressing ring 122 may be 250 mm~400 mm. Preferably, the inner diameter of the pressure ring 122 may be 280 mm~420 mm. More preferably, the inner diameter of the pressing ring 122 may be 300 mm~400 mm. Preferably, the inner diameter of the pressure ring 122 may be 310 mm~390 mm. More preferably, the inner diameter of the pressing ring 122 may be 310 mm~390 mm. Preferably, the inner diameter of the pressing ring 122 may be 320 mm~380 mm. More preferably, the inner diameter of the pressure ring 122 may be 330 mm~370 mm. Preferably, the inner diameter of the pressure ring 122 may be 340 mm~360 mm. More preferably, the inner diameter of the pressure ring 122 may be 345 mm~355 mm. A thickness of the pressing ring 122 may be 8 mm~15 mm. More preferably, the thickness of the pressing ring 122 may be 10 mm~13 mm. More preferably, the thickness of the pressing ring 122 may be 11 mm~12 mm.

In some embodiments, the temperature field device 100 may further include a gas channel 124. The gas channel 124 may be mounted on the observation unit 118, and a size of the gas channel 124 may be matched with that of the second through hole 420 to form a through tube protruding from the observation unit 118. In this case, the gas channel 124 may be connected to a gas inlet tube and/or a gas outlet tube to introduce the gas into the temperature field device 100.

In some embodiments, the temperature field device 100 may be applied in crystal growth. After being weighed and performed a preprocessing operation (e.g., an operation of high-temperature baking, room temperature mixing, isostatic pressing) according to a reaction equation, the reactants for growing crystals may be placed in the crucible 114 for reaction. Different crystals may require different growth conditions, for example, different temperature gradients. Accordingly, the temperature gradient may be adjusted by changing an amount and a tightness of the filler 108 (e.g., the filler 108 filled in the second drum 106) filled in the temperature field component 100. For example, the amount of the filler 108 may determine the relative position of the crucible 114 and the induction coil 116, and further determine a heating center of the temperature field. Meanwhile, the higher the tightness of the filler 108 is, the better the heat insulation effect and the stability of the formed temperature field may be, and the more beneficial for crystal growth may be. After the amount and the tightness of the filler 108 are determined, other components may be mounted and sealed. After all the components are mounted, a gas may be introduced into the temperature field device 100, and an auxiliary component (e.g., a cooling circulation pump) may be activated to introduce a coolant to the circulating coolant channel(s) of the bottom plate 102 and the first cover plate 110. Then, the crystal growth apparatus (including the temperature field device 100) may be activated to start the crystal growth. The gas introduced into the temperature field device 100 may enter through one or more first through holes (e.g., f one or more gas channels 124). The gas exiting from the temperature field device 100 may be discharged through the remaining first through holes (e.g., one or more gas channels 124), the first through hole(s) through which the gas is introduced, or the third through hole. Through processes such as seed crystal preheating, seeding, necking, shouldering, diameter-constant control, ending, cooling, and crystal taking, the crystal growth process may be finalized.

The possible beneficial effects of the present disclosure may include but not limited to: (1) the first drum is added, which can form a new thermal insulation layer together with the filler filled in the space between the first drum and the second drum, thereby effectively preventing the problem of sudden temperature change caused by the cracking of the second drum and improving the stability performance and a count of reusable times of the temperature field device; (2) the temperature gradient of the temperature filed can be adjusted by adjusting the filling height and/or the tightness of the filler; (3) the internal situation of the relatively closed temperature field device can be conveniently observed by using the observation unit. Meanwhile, a flowing gas can be introduced into the temperature field device through the observation unit; (4) reactants can be automatically added during the crystal growth process to achieve uniformity and consistency of the crystal growth. It should be noted that different embodiments may have different beneficial effects. In different embodiments, possible beneficial effects may be any of the above effects, or any combination thereof, or any other beneficial effects that may be obtained.

EXAMPLES

The present disclosure may be further described through the following specific examples.

Example 1

The Mounting of the Temperature Field Device 100

Step 1: The bottom plate 102 may be mounted on an aluminum mounting plate of a crystal growth furnace. According to a level requirement of 0.02, the level requirement of the bottom plate 102 may be adjusted.

Step 2: The second drum 106 may be mounted on the bottom plate 102. The concentricity and the verticality between the second drum 106 and the bottom plate 102 may be adjusted. The concentricity may be less than 0.5 mm and the perpendicularity may be less than 0.2 degrees.

Step 3: The first drum 104 may be mounted on the bottom plate 102. The concentricity and the verticality between the first drum 104 and the bottom plate 10 may be adjusted. The concentricity may be less than 0.5 mm and the perpendicularity may be less than 0.2 degrees. After the first drum is mounted, a high-temperature glue may be used to seal the joint between the first drum 104 and the bottom plate 102, ensuring positive pressure without air leakage.

Step 4: The filler 108 may be filled in the space between the first drum 104 and the second drum 106 and the bottom of the second drum 106. The amount and the tightness of the filler may be determined according to the growth condition of the crystal to be grown.

Step 5: The crucible 114 may be placed on the filler 108 that is filled on the bottom of the second drum 106. The vertical distance between the upper edge of the crucible 114 and the upper edge of the induction coil 116 may be −20 mm~6 mm. The vertical distance may be negative when the upper edge of crucible 114 is below the upper edge of induction coil 116, the vertical distance may be zero when the upper edge of crucible 114 and the upper edge of the induction coil 116 are flush, and the vertical distance may be positive when the upper edge of crucible 114 is above the upper edge of the induction coil 116. The vertical distance may be adjusted according to the growth condition of the crystals to be grown.

Step 6: The second cover plate 112 may be mounted above the second drum 106. The concentricity among the second cover plate 112, the first drum 104 and the second drum 106 may be adjusted.

Step 7: The pressure ring 122 and the sealing ring 120 covered with vacuum grease may be mounted.

Step 8: The first cover plate 110 may be mounted above the first drum 104. The concentricity between the first cover plate 110 and the first drum 104 may be adjusted to ensure that a first through hole (the first through hole 310-1/310-2) on the cover plate 110 has the same axis as a corresponding fourth through hole on the second cover plate 112. The pressure ring 122 and the first cover plate 110 may be connected by threads and the sealing ring 120 may be compressed tightly to achieve the sealing, ensuring positive pressure without air leakage.

Step 9: The observation unit 118 may be mounted on the first cover plate 110. A gas inlet tube and/or a gas outlet tube may be connected to the gas channel 124. Then, the temperature field device 100 may be completely mounted.

Example 2

LYSO Crystal Growth

A single crystal growth furnace with an open furnace body using medium-frequency induction heating and the Czochralski technique was used to grow crystals. Part of the temperature field device was mounted according to step 1 through step 5 in Example 1, wherein the diameter of the crucible 114 was 120 mm. The reactants were weighed according to the following reaction equation:

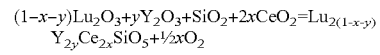

$(1-x-y)Lu_2O_3+yY_2O_3+SiO_2+2xCeO_2=Lu_{2(1-x-y)}Y_{2y}Ce_{2x}SiO_5+\frac{1}{2}xO_2$ where x denotes a mole fraction of Ce ion doped in a melt and y denotes a mole fraction of Y ion doped in the melt. The total weight of reactants was 9500 g. After the reactants were added into the crucible 114, the crucible 114 was placed back, and the position of the crucible 114 and the concentricity of the crucible 114 and the second drum 106 were adjusted. Then step 6 through step 9 in Example 1 were performed to mount the temperature field device 100, the gas was introduced, and the coolant was circulated. Then the induction coil 116 was energized to increase the temperature, melt the materials, and perform crystal growth. A speed of the crystal growth was 0.5 mm/h~3 mm/h, a rotation speed was 0.5 rpm~15 rpm, and a convex interface growth was maintained. Finally, an LYSO crystal with a diameter of 60 mm and a length of 264 mm is grown. The crystal has a constant diameter length of 200 mm and a weight of the crystal is 5000 g. The crystal has a complete shape, no cracks, no clouds, no dislocations, no structural defects, and uniform optical properties.

Example 3

LYSO Crystal Growth

A single crystal growth furnace with an open furnace body using medium-frequency induction heating and the Czochralski technique was used to grow crystals. Part of the temperature field device was mounted according to step 1 through step 5 in example 1, wherein the diameter of the crucible 114 was 180 mm. The reactants were weighed according to the following reaction equation:

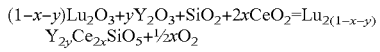

where x denotes a mole fraction of Ce ion doped in a melt, and y denotes a mole fraction of Y ion doped in the melt. The total weight of reactants was 27300 g. After adding the reactants into the crucible 114, the crucible 114 was placed back, and the position of the crucible 114 and the concentricity of the crucible 114 and the second drum 106 were adjusted. Then step 6 through step 9 in Example 1 were performed to mount the temperature field device 100, the gas was introduced, and the coolant was circulated. Then the induction coil 116 was energized to increase the temperature, melt the materials, and perform crystal growth. A speed of crystal growth was 0.5 mm/h~3 mm/h, a rotation speed was 0.5 rpm 15 rpm, and a convex interface growth was maintained. Finally, an LYSO crystal with a diameter of 110 mm and a length of 275 mm is grown. The crystal has a constant diameter length of 160 mm and a weight of the crystal is 13500 g. The crystal has a complete shape, no cracks, no clouds, no dislocations, no structural defects, and uniform optical properties.

The basic concepts have been described above. Obviously, for those skilled in the art, the detailed disclosure is merely by way of example and does not constitute a limitation on the present disclosure. Although not explicitly stated here, those skilled in the art may make various modifications, improvements, and amendments to the present disclosure. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure, or characteristic described in connection with the embodiment is included in at least one embodiment of the present disclosure. Therefore, it is emphasized and should be appreciated that two or more references to "an embodiment," "one embodiment," or "an alternative embodiment" in various portions of this specification are not necessarily all referring to the same embodiment. In addition, certain features, structures, or characteristics in one or more embodiments of the present disclosure may be appropriately combined.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure method does not mean that the present disclosure object requires more features than the features mentioned in the claims. Rather, claimed subject matter may lie in less than all features of a single foregoing disclosed embodiment.

In some embodiments, the numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters set forth in the description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters configured to illustrate the broad scope of some embodiments of the present disclosure are approximations, the numerical values in specific examples may be as accurate as possible within a practical scope.

Each patent, patent application, patent application publication and other materials cited herein, such as articles, books, instructions, publications, documents, etc., are hereby incorporated by reference in their entirety. Application history documents that are inconsistent or conflicting with the contents of the present disclosure are excluded, and documents (currently or later attached to the present disclosure) that limit the widest range of the scope of the present disclosure are also excluded. It should be noted that if the description, definition, and/or terms used in the appended application of the present disclosure is inconsistent or conflicting with the content described in the present disclosure, the use of the description, definition and/or terms of the present disclosure shall prevail.

At last, it should be understood that the embodiments described in the present disclosure are merely illustrative of the principles of the embodiments of the present disclosure. Other modifications may be within the scope of the present disclosure. Accordingly, by way of example, and not limitation, alternative configurations of embodiments of the present disclosure may be considered to be consistent with the teachings of the present disclosure. Accordingly, the embodiments of the present disclosure are not limited to the embodiments explicitly described and described by the present disclosure.

What is claimed is:

1. A temperature field device, comprising:
a bottom plate, a first cover plate, a second cover plate, an observation unit, a first drum, a second drum, and a filler, wherein:
the bottom plate is mounted on a bottom of the temperature field device and covers an end of the first drum;
the first cover plate is mounted on a top of the temperature field device and covers the other end of the first drum, wherein the first cover plate includes two first through holes configured to allow a gas to enter into and exit from the temperature field device respectively, rotation central axes of the two first through holes being perpendicular to a horizontal plane or forming angles of 3 degrees-20 degrees with a vertical line of the horizontal plane;

the second cover plate is mounted inside the first drum and covers a top open end of the second drum, wherein the second cover plate includes two second through holes corresponding to the two first through holes respectively, the second through holes having the same rotation central axes as corresponding first through holes;

the second drum is mounted inside the first drum;

the filler is filled inside at least one of the second drum or a space between the second drum and the first drum;

the observation unit is mounted above the first cover plate and connected with one of the two first through holes; and a concentricity among the first drum, the second drum, and the bottom plate is less than 1 mm.

2. The temperature field device of claim 1, wherein a perpendicularity among the first drum, the second drum, and the bottom plate is less than 0.2°.

3. The temperature field device of claim 1, wherein a thickness of the bottom plate is within 10-40 mm.

4. The temperature field device of claim 1, wherein a level requirement of the bottom plate is less than 0.5 mm/m, wherein the level requirement of the bottom plate refers to a height difference between two ends of the bottom plate per unit length.

5. The temperature field device of claim 1, wherein the bottom plate or the first cover plate includes at least one cooling loop mounted inside the bottom plate or the first cover plate.

6. The temperature field device of claim 5, wherein a shape of the at least one cooling loop includes a spiral shape or a snake shape.

7. The temperature field device of claim 1, wherein a thickness of the first cover plate is within 10-40 mm.

8. The temperature field device of claim 1, wherein the first cover plate further includes:

a third through hole configured to allow a pulling rod to enter into or exit from the temperature field device, wherein the third through hole is located between the two first through holes.

9. The temperature field device of claim 8, wherein a diameter of each of the two first through holes is within 15-30 mm.

10. The temperature field device of claim 8, wherein a distance between the two first through holes is within 70-150 mm.

11. The temperature field device of claim 8, the observation unit including:

a chamber connected with one of the two first through holes;

a fourth through hole connected with the chamber, the fourth through hole being configured to allow the gas to enter into or to exit from the temperature field device; and an observation window mounted on a top of the observation unit.

12. The temperature field device of claim 1, wherein a thickness of the first drum is within 1-15 mm.

13. The temperature field device of claim 1, wherein a thickness of the second drum is within 8-30 mm.

14. The temperature field device of claim 1, wherein the filler is made of a heat resistant material.

15. The temperature field device of claim 1, wherein the filler includes at least one of a granule shaped material, a brick shaped material, or a felt shaped material.

16. The temperature field device of claim 1, wherein a particle size of the filler is 5 mesh~200 mesh, 50 mesh~150 mesh, or 80 mesh~120 mesh.

17. The temperature field device of claim 1, wherein the filler inside the second drum is at least configured to support a crucible and cover a portion of the crucible.

18. The temperature field device of claim 17, wherein a filling height of the filler results in that a vertical distance between an upper edge of the crucible and an upper edge of an induction coil mounted outside the temperature field device is within 0 mm~∓50 mm, wherein "−" represents that the upper edge of the crucible is lower than the upper edge of the induction coil and "+" represents that the upper edge of the crucible is higher than the upper edge of the induction coil.

19. The temperature field device of claim 1, wherein a thickness of the second cover plate is within 20-35 mm.

* * * * *